(12) United States Patent
Shiga et al.

(10) Patent No.: US 7,561,459 B2
(45) Date of Patent: Jul. 14, 2009

(54) SEMICONDUCTOR MEMORY DEVICE

(75) Inventors: Hidehiro Shiga, Kamakura (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 11/898,605

(22) Filed: Sep. 13, 2007

(65) Prior Publication Data

US 2008/0068874 A1  Mar. 20, 2008

(30) Foreign Application Priority Data

Sep. 14, 2006  (JP)  ............................. 2006-249768

(51) Int. Cl.
*G11C 11/22* (2006.01)
(52) U.S. Cl. .................. 365/145; 365/230.08
(58) Field of Classification Search ................. 365/145, 365/149, 230.03
See application file for complete search history.

(56) References Cited

U.S. PATENT DOCUMENTS 5,737,260 A * 4/1998 Takata et al. ................. 365/145
6,353,550 B1 * 3/2002 Hirano ........................ 365/145
6,707,704 B2 * 3/2004 Kato et al. ................... 365/145

FOREIGN PATENT DOCUMENTS

JP    2005-209324    8/2005

\* cited by examiner

*Primary Examiner*—Anh Phung
(74) *Attorney, Agent, or Firm*—Finnegan, Henderson, Farabow, Garrett & Dunner, L.L.P.

(57) ABSTRACT

This disclosure concerns a semiconductor memory device including a ferroelectric capacitor; a cell transistor having a source connected to a first electrode of the ferroelectric capacitor; bit lines; word lines; n plate lines corresponding to n column blocks and connected to a second electrodes of the ferroelectric capacitors in the corresponding column blocks, respectively, the n column blocks being obtained by dividing the cell array into the n column blocks for every set of m columns, where $n \geq 2$ and $m \geq 2$; a plurality of reset transistors connected between the bit lines and the n plate lines; and m reset lines corresponding to the m columns within the column blocks and connected to gates of n reset transistors of the reset transistors, the n reset transistors being respectively provided in n columns respectively included in the n column blocks.

14 Claims, 12 Drawing Sheets

CA: CELL ARRAY
MC: MEMORY CELL
FC: FERROELECTRIC CAPACITOR
CT: CELL TRANSISTOR
RT: RESET TRANSISTOR
ST: SELECTION TRANSISTOR
PL: PLATE LINE
RS: RESET LINE
BS: BIT SELECTION LINE
CL: COLUMN
CB: COLUMN BLOCK

SEMICONDUCTOR MEMORY DEVICE

CROSS-REFERENCE TO RELATED APPLICATION

This application is based upon and claims the benefit of priority from the prior Japanese Patent Application No. 2006-249768, filed on Sep. 14, 2006, the entire contents of which are incorporated herein by reference.

BACKGROUND OF THE INVENTION

1. Field of the Invention

The present invention relates to a semiconductor memory device such as a semiconductor memory device using a ferroelectric capacitor for memory cells.

2. Related Art

A ladder ferroelectric RAM (Random Access Memory) includes plate lines corresponding to bit lines provided in respective memory cell columns. Furthermore, such a ferroelectric RAM includes at least one reset line for resetting all memory cells in a cell array. Accordingly, if the number of bit lines is k in a certain cell array, k plate lines and at least one reset line are necessary. Namely, to drive a cell array including memory cells in k columns, the sum of the number of plate lines and that of reset lines is equal to or greater than (k+1).

If the numbers of plate lines and reset lines are large, an area of wirings for these lines is disadvantageously made large. Further, if the numbers of plate lines and reset lines are large, circuits for driving these lines are disadvantageously made large in scale.

SUMMARY OF THE INVENTION

A semiconductor memory device according to an embodiment of the present invention comprises a ferroelectric capacitor including a ferroelectric between a first electrode and a second electrode; a cell transistor having a source connected to the first electrode; a cell array in which a plurality of memory cells including the ferroelectric capacitors and the cell transistors are arranged in a matrix on a semiconductor substrate; a plurality of bit lines provided to correspond to columns of the memory cells and connected to a drain of the cell transistor; a plurality of word lines provided to correspond to rows of the memory cells and connected to a gate of the cell transistor; n plate lines corresponding to n column blocks and connected to the second electrodes of the ferroelectric capacitors in the corresponding column blocks, respectively, the n column blocks being obtained by dividing the cell array into the n column blocks for every set of m columns, where n≧2 and m≧2; a plurality of reset transistors connected between the bit lines and the n plate lines; and m reset lines corresponding to the m columns within the column blocks and connected to gates of n reset transistors of the reset transistors, the n reset transistors being respectively provided in n columns respectively included in the n column blocks.

A semiconductor memory device according to an embodiment of the present invention comprises a ferroelectric capacitor including a ferroelectric between a first electrode and a second electrode; a cell transistor having a source connected to the first electrode; a cell array in which a plurality of memory cells including the ferroelectric capacitors and the cell transistors are arranged in a matrix on a semiconductor substrate; a plurality of bit lines provided to correspond to columns of the memory cells and connected to a drain of the cell transistor; a plurality of word lines provided to correspond to rows of the memory cells and connected to a gate of the cell transistor; a plurality of reset transistors connected between the bit lines and the plate lines; n reset lines corresponding to n column blocks, the n column blocks being obtained by dividing the cell array into the n column blocks for every set of m columns, where n≧2 and m≧2, the n reset lines being connected to gates of m reset transistors provided for one of the n column blocks; and m plate lines provided for the n columns respectively included in the n different column blocks and connected to the second electrodes provided in the n columns.

DETAILED DESCRIPTION OF THE INVENTION

Embodiments of the present invention will be explained below with reference to the accompanying drawings. The present invention is not limited to the embodiments.

First Embodiment

Figure 1:
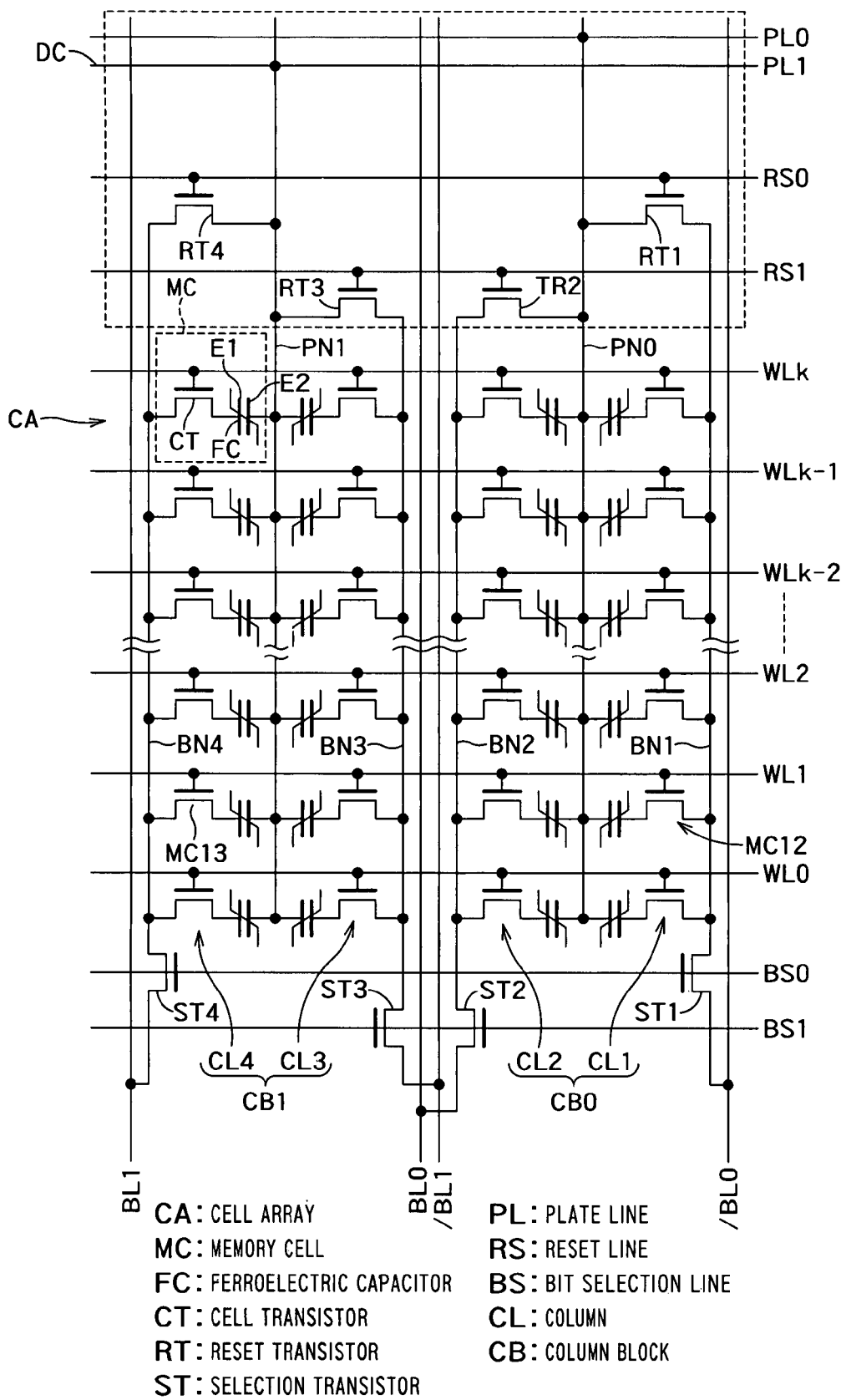
FIG. 1 is a circuit diagram showing an internal configuration of a ferroelectric memory device according to a first embodiment of the present invention.

FIG. 1 is a circuit diagram showing an internal configuration of a ferroelectric memory device according to a first embodiment of the present invention. Each cell array CA includes a plurality of memory cells MCs arranged in a matrix on a semiconductor substrate. Each of the memory cells MCs includes a ferroelectric capacitor FC and a cell transistor CT. The ferroelectric capacitor FC includes a ferroelectric between a first electrode E1 and a second electrode E2. A source of the cell transistor CT is connected to the first electrode E1, and a drain thereof is connected to one of bit lines BL0, BL1, /BL0, and /BL1 via one of bit nodes BN1 to BN4 and one of selection transistors ST1 to ST4. It is to be noted that reference symbols are given only to one memory cell MC and not given to the other memory cells MCs. Symbol "/ (bar)" means signal inversion.

Each of the bit lines BL0, BL1, /BL0, and /BL1 is provided for the memory cells MCs arranged in a column direction. Each of word lines WL0 to WLk is provided for the memory cell MCs arranged in a row direction, and connected to a gate of each memory cell MC.

The memory cells MCs are arranged in four columns CL1 to CL4. The columns CL1 and CL2 are adjacent to each other and connected to a plate node PN0 in common. The columns CL3 and CL4 are adjacent to each other and connected to a plate node PN1 in common. The columns CL1 and CL2 constitute a column block CB0, and the columns CL3 and CL4 constitute a column block CB1. In this way, pairs of columns of the cell arrays CAs are divided into two column blocks CB0 and CB1, respectively. Plate lines PL0 and PL1 are provided to correspond to the respective column blocks CB0 and CB1. The plate line PL0 is connected to the second electrodes E2 of ferroelectric capacitors FC of the respective memory cells MCs within the column block CB0 in common via the plate node PN0. The plate line PL1 is connected to the second electrodes E2 of ferroelectric capacitors FC within the column block CB1 in common via the plate node PN1.

Bit nodes BN1 to BN4 are connected to the bit lines /BL0, /BL1, BL0, and BL1 via selection transistors ST1 to ST4, respectively. The bit nodes BN1 and BN2 are connected to the plate node PN0 in common via reset transistors RT1 and RT2, respectively. The bit nodes BN3 and BN4 are connected to the plate node PN1 in common via reset transistors RT3 and RT4, respectively.

A reset line RS0 is connected to gates of the reset transistors RT1 and RT4, and a reset line RS1 is connected to gates of the reset transistors RT2 and RT3. Namely, the reset lines RS0 and RS1 are provided to correspond to the two respective columns CL1 and CL2 within the column block CB0, and provided to correspond to the two respective columns CL3 and CL4 within the column block CB1. Moreover, the reset line RS0 is connected to the gates of the two reset transistors RT1 and RT4 respectively provided in the two columns CL1 and CL4 which are respectively included in the two column blocks CB0 and CB1. The reset line RS1 is connected to the gates of the two reset transistors RT2 and RT3 respectively provided for the other two columns CL2 and CL3 which are respectively included the two column blocks CB0 and CB1.

In the first embodiment, one of the bit lines BL0 and /BL0 transmits information data stored in the memory cells MCs whereas the other bit line /BL0 or BL0 transmits reference data. Further, one of the bit lines BL1 and /BL1 transmits information data stored in the memory cells MCs whereas the other bit line /BL1 or BL1 transmits reference data. The reference data has a potential between potentials of data "0" and data "1" and is generated by a reference data generation circuit (not shown).

The bit line BL0 corresponding to the column block CB0 is arranged near the column block CB1, and the bit line BL1 corresponding to the column block CB1 is arranged near the column block CB0. The bit line BL0 is connected to the selection transistor ST2 and the bit node BN2 by a wiring crossing the bit line /BL1. The bit line /BL1 is connected to the selection transistor ST3 and the bit node BN3 by a wiring crossing the bit line BL0. Namely, a positional relationship between the bit lines BL0 and /BL1 is inverse to a connection relationship therebetween in which the bit lines BL0 and /BL1 are connected to the column blocks CB0 and CB1, respectively. In the first embodiment, potentials of inactive bit lines BLs are fixed and the bit lines BLs are employed as shielding lines. By doing so, interference noise generated between a pair of bit lines BLs used to read data can be cancelled.

Figure 2:
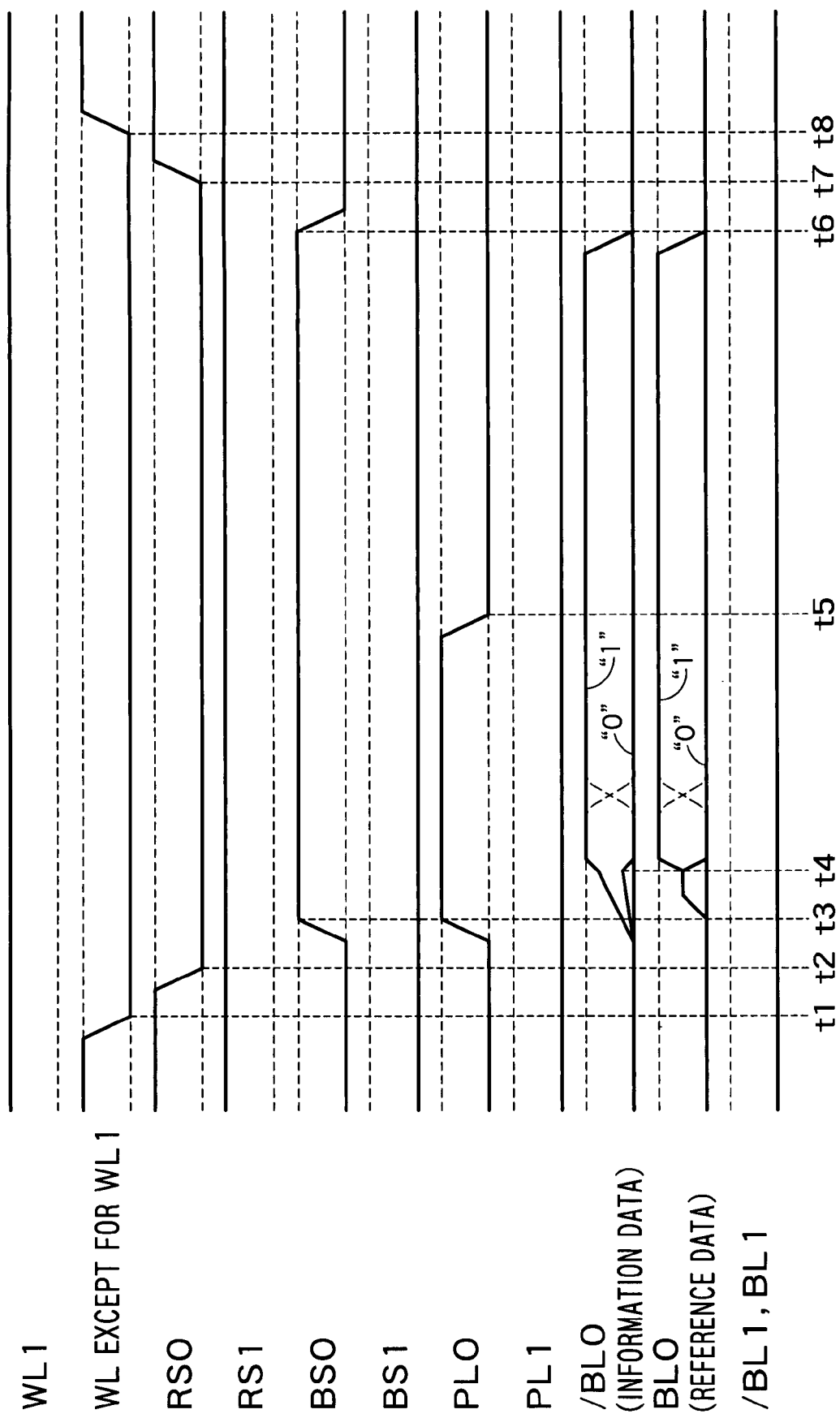
FIG. 2 is a timing chart showing a data read operation performed by the ferroelectric memory device according to the first embodiment.

FIG. 2 is a timing chart showing a data read operation performed by the ferroelectric memory device according to the first embodiment. In the first embodiment, it is assumed that a memory cell MC12 specified by the word line WL1 and the bit line /BL0 is selected.

Before t1, the word lines WLs and the reset lines RS0 and RS1 are active (at high level). The cell transistors CTs and the reset transistors RT1 to RT4 are thereby all turned on. Due to this, the first electrode E1 of each ferroelectric capacitor FC is shorted to the second electrode E2 via the corresponding cell transistor CT and one of the reset transistors RT1 to RT4, and the first electrode E1 is made equal in potential to the second electrode E2. As a result, data in each of the ferroelectric capacitors FCs is held.

At t1, unselected word lines WLs other than the selected word line WL1 are deactivated (made low level). By doing so, only the cell transistors CTs connected to the selected word line WL1 are kept to be turned on, and the other transistors CTs are turned off.

At t2, the reset line RS0 is deactivated. The reset transistors RT1 and RT4 thereby make bit nodes BN1 and BN4 disconnect from the plate nodes PN0 and PN1, respectively. The reset transistors RT2 and RT3 connect the bit nodes BN2 and BN3 to the plate nodes PN0 and PN1, respectively. That is, by driving the reset line RS0, one of the two columns in each of the column blocks CB0 and CB1, i.e., the two columns CL1 and CL4 are selected.

At t3, the bit selection line BS0 and the plate line PL0 are activated. By activating the bit selection line BS0, the bit line /BL0 is connected to the bit node BN1. Furthermore, by activating the plate line PL0, the column block CB0 is selected and potential difference is generated between both ends of the ferroelectric capacitor FC of the memory cell MC12. At this moment, the reset line RS1 is active, so that the reset transistor RT2 shorts the bit node BN2 to the plate node PN0. Accordingly, the potential difference caused by the plate line PL0 is not applied to the ferroelectric capacitor FC of each of the memory cells MCs in the column CL2. As a result, the information data stored in the memory cell MC12 is read to the bit line /BL0.

At this moment, the reset transistor RT4 is turned off and the selection transistor ST4 is turned on. Therefore, the electrode E1 is connected to the bit line BL1 and the electrode E2 is connected to the plate line PL1 in the ferroelectric capacitor FC of a memory cell MC13 specified by the word line WL1 and the bit line BL1. However, because of equal potential kept between the bit line BL1 and the plate line PL1, no potential difference is generated between both ends of the ferroelectric capacitor FC of the memory cell MC13.

During a period from t3 to t4, the reference data is transmitted to the bit line BL0. A sense amplifier compares a potential or current of the bit line /BL0 with that of the bit line BL0, and detects the information data stored in the bit line /BL0. The read information data is output to outside via a buffer.

If the information data is "0", the potential of the bit line /BL0 is at low level. Therefore, during a period from t4 to t5, the potential difference is given to the ferroelectric capacitor FC of the selected memory cell MC12 while the plate line PL0 is active (at high level). By doing so, the data "0" is rewritten to the selected memory cell MC12.

If the information data is "1", the potential of the bit line /BL0 is at high level. Therefore, during a period from t5 to t6, a potential having a reversed polarity from that of a "0" writing potential is applied to the ferroelectric capacitor FC of the selected memory cell MC12 while the plate line PL0 is inactive (at low level). The data "1" is thereby rewritten to the selected memory cell MC12.

At t6, the bit selection line BS0 is deactivated and the bit line /BL0 is thereby disconnected from the bit node BN1. At t7, the reset line RS0 is activated, and at t8, the word lines WLs other than the selected word line WL1 are activated.

A data write operation performed by the ferroelectric memory device is similar to the data read operation from t1 to t4 shown in FIG. 2. Thereafter, during the period from t4 to t5, if to-be-written data input from the outside differs from the read information data, the data stored in the bit line /BL0 is inverted. A manner of inverting the data is indicated by broken lines in FIG. 2. A subsequent data rewrite operation and an operation from t6 to t8 are similar to those described above.

According to the first embodiment, during data writing or data reading, the plate line PL0 or PL1 selects one of the column blocks CB0 and CB1, and potential is applied to the ferroelectric capacitors of the memory cells MC2 within the selected column block CB0 or CB1 (CB0 in the first embodiment). Moreover, the reset line RS0 or RS1 selects the column CL1 or CL2 (CL1 in the first embodiment) in the selected column block CB0, and the reset transistor in the selected column is turned off. Thus, one of the columns CL1 to CL4 can be selected according to a combination of the selections.

According to the first embodiment, the plate line selects one column block and the reset line selects one column in the selected column block. However, the concept of the selections may be opposite. For example, the reset line may select one column block and the plate line may select one column within the selected column block. In this case, each of the columns CL1 and CL4 and the columns CL2 and CL3 shown in FIG. 1 conceptually constitutes one column block.

Conventionally, to drive a cell array including memory cells in four columns, the sum of the number of plate lines and that of reset lines is equal to or greater than five.

According to the first embodiment, the sum of the number of plate lines and that of reset lines is four. Therefore, according to the first embodiment, it is possible to decrease the total number of plate lines and the reset lines of the ferroelectric memory device and to downsize the ferroelectric memory device.

Modification of First Embodiment

The first embodiment relates to a so-called 1T (Transistor)-1C (Capacitor) ferroelectric memory device. A modification of the first embodiment is an embodiment in which the first embodiment is applied to a 2T-2C ferroelectric memory device. In the 2T-2C ferroelectric memory device, paired bit lines BL0 and /BL0 transmit data at reversed polarities from each other, respectively. Likewise, paired bit lines BL1 and /BL1 transmit data at reversed polarities from each other, respectively. By doing so, one-bit data is detected from the paired bit lines BL0 and /BL0 and one-bit data is detected from the paired bit lines BL1 and /BL1. In this case, the data stored in one of the paired bit lines BL0 and /BL0 refers to the data stored in the other bit line /BL0 or BL0 as reference data, and the other data refers to the data stored in one of the paired bit line BL0 or /BL0 as reference data. It is, therefore, possible to dispense with a reference data generation circuit.

An internal configuration of a cell array CA according to the modification is similar to that shown in FIG. 1.

Figure 3:
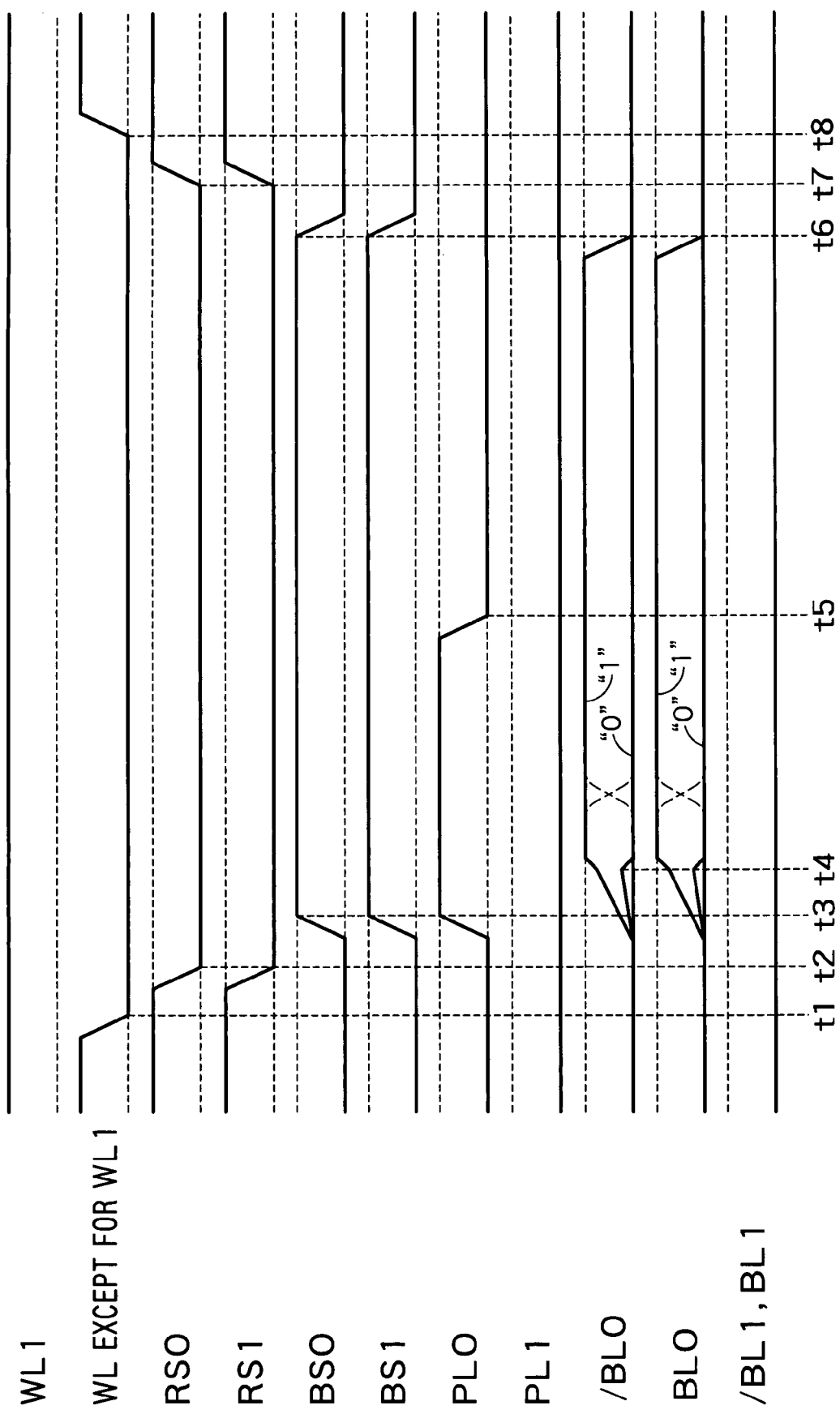
FIG. 3 is a timing chart showing a data read operation performed by the ferroelectric memory device according to a modification of first embodiment.

FIG. 3 is a timing chart showing a data read operation performed by the ferroelectric memory device according to the modification. In the modification, it is assumed that a column block CB0 is selected and that information data is read to the bit lines BL0 and /BL0. The operation shown in FIG. 3 differs from that shown in FIG. 2 in that a reset line RS1 operates similarly to a reset line RS0 and that a bit selection line BS1 operates similarly to a bit selection line BS0. Selection transistors ST1 to ST4 are thereby all turned on. In addition, reset transistors RT1 to RT4 are all turned off. While the plate line PL1 is deactivated, the plate line PL0 is activated. As a result, the column block CB0 is selected. Two memory cells MCs connected to a word line WL1 within the column block CB0 are selected. From these selected memory cells MCs, data is transmitted to the bit lines BL0 and /BL0, respectively. A sense amplifier (not shown) detects one of data read to the bit lines BL0 and /BL0, while the other of the data read to the bit lines BL0 and /BL0 is set as the reference data. It is to be noted that the data stored in the memory cells MCs connected to the column CL1 should have a reversed polarity from that of the data stored in the memory cells MCs connected to the column CL2. Likewise, the data stored in the memory cells MCs connected to the column CL3 should have a reversed polarity from that of the data stored in the memory cells MCs connected to the column CL4. Accordingly, if data different from the read data is to be written during the data write operation, not only the data on the bit line /BL0 but also the data on the bit line BL0 are inverted. A manner of inverting the data is indicated by broken lines in FIG. 3. Because the other operations according to the modification are similar to those according to the first embodiment, they will not be described herein. The 2T-2C ferroelectric memory device according to the modification can attain the same advantages as those of the 1T-1C ferroelectric memory device according to the first embodiment.

Second Embodiment

Figure 4:
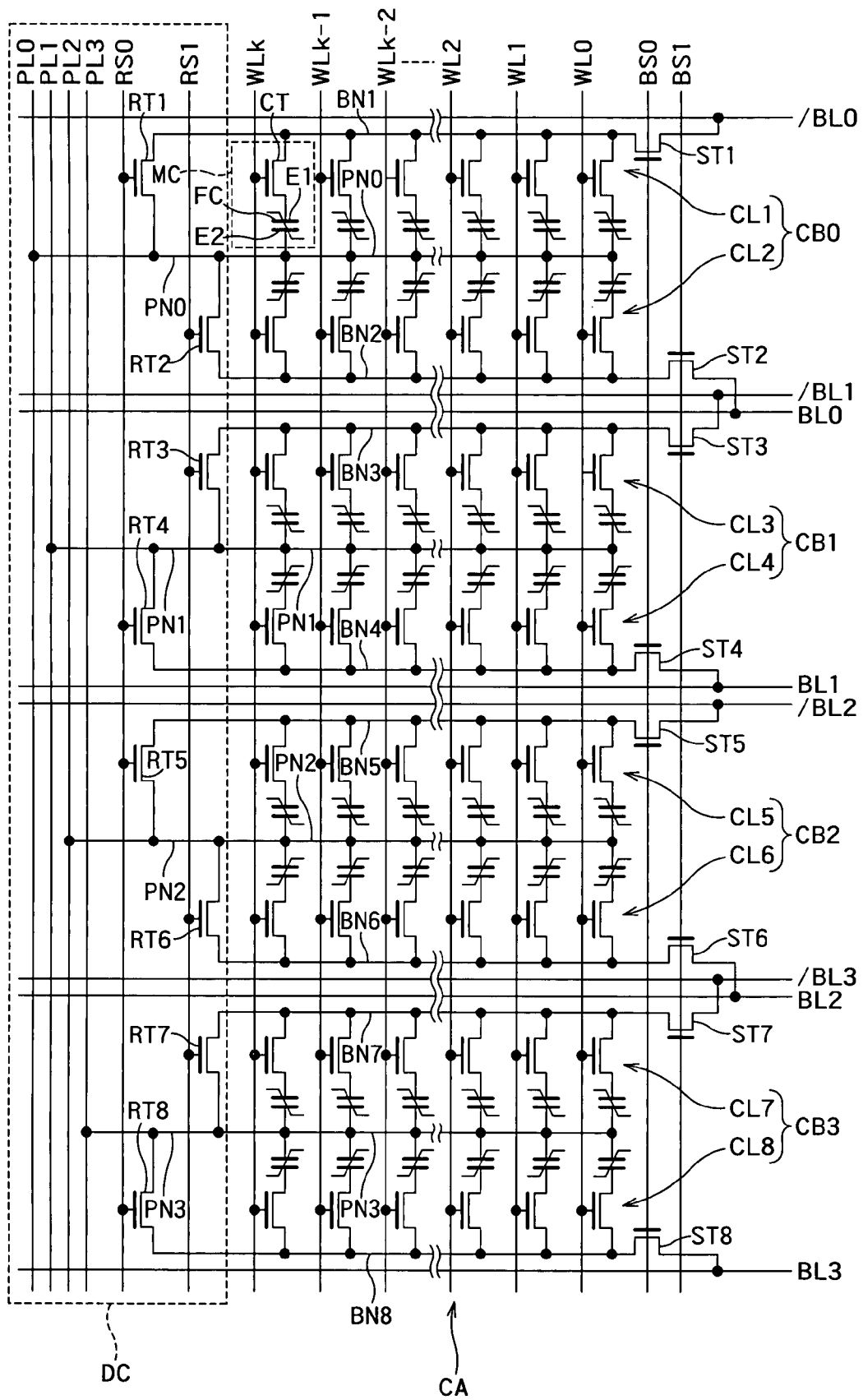
FIG. 4 is a circuit diagram showing an internal configuration of a ferroelectric memory device according to a second embodiment of the present invention.

FIG. 4 is a circuit diagram showing an internal configuration of a ferroelectric memory device according to a second embodiment of the present invention. According to the second embodiment, each of cell arrays CAs includes eight columns CL1 to CL8. A configuration of each of memory cells MCs included in each of the columns CL1 to CL8 is similar to that of the memory cell MC according to the first embodiment. Further, configurations of column blocks CB0 and CB1 are similar to those of the column blocks CB0 and CB1 according to the first embodiment, respectively.

The configuration of the ferroelectric memory device according to the second embodiment is such that column blocks CB2, CB3 and plate lines PL2, PL3 are added to the ferroelectric memory device according to the first embodiment. The column block CB2 includes the columns CL5 and CL6. The columns CL5 and CL6 are connected to a plate node PN2 in common and adjacent to each other. A drain of a cell transistor CT of each of the memory cells MCs in the column CL5 is connected to a bit line /BL2 via a bit node BN5 and a selection transistor ST5. A second electrode E2 of a ferroelectric capacitor FC of each of the memory cells MCs in the column CL5 is connected to the plate node PN2 in common. The drain of the cell transistor CT of each of the memory cells MCs in the column CL6 is connected to a bit line BL2 via a bit node BN6 and a selection transistor ST6. The second electrode E2 of the ferroelectric capacitor FC of each of the memory cells MCs in the column CL6 is connected to the plate node PN2 in common.

The column block CB3 includes the columns CL7 and CL8. The columns CL7 and CL8 are connected to a plate node PN3 in common and adjacent to each other. The drain of the cell transistor CT of each of the memory cells MCs in the column CL7 is connected to a bit line /BL3 via a bit node BN7 and a selection transistor ST7. The second electrode E2 of the ferroelectric capacitor FC of each of the memory cells MCs in the column CL7 is connected to the plate node PN3 in common. The drain of the cell transistor CT of each of the memory cells MCs in the column CL8 is connected to a bit line BL3 via a bit node BN8 and a selection transistor ST8. The second electrode E2 of the ferroelectric capacitor FC of each of the memory cells MCs in the column CL8 is connected to the plate node PN3 in common.

The plate node PN2 is connected to the plate line PL2, and the plate node PN3 is connected to the plate line PL3.

Basically, the ferroelectric memory device according to the second embodiment operates similarly to that according to the first embodiment. In the second embodiment, one of plate lines PL0 to PL3 selects one of the column blocks CB0 to CB3, and one of reset lines RS0 and RS1 selects one of the columns CLs within the selected column block CB.

Conventionally, to drive a cell array including memory cells in eight columns, the sum of the number of plate lines and that of reset lines is equal to or greater than nine.

According to the second embodiment, the sum of the number of plate lines and that of reset lines is six. Therefore, it is possible to decrease the total number of plate lines and the reset lines of the ferroelectric memory device and to downsize the ferroelectric memory device.

The second embodiment is applicable to both the 1T-1C ferroelectric memory device and the 2T-2C ferroelectric memory device, similarly to the first embodiment.

Third Embodiment

Figure 5:
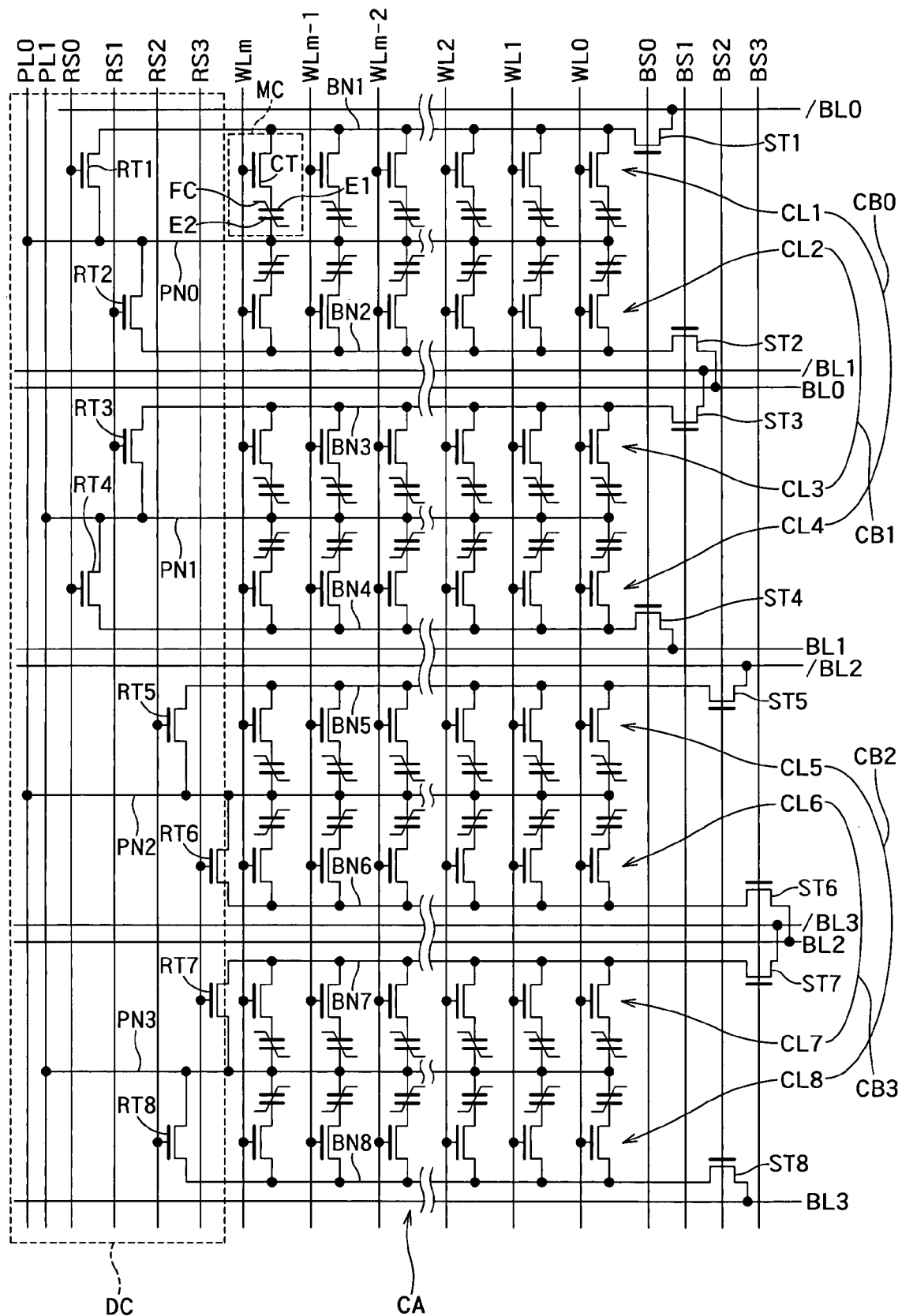
FIG. 5 is a circuit diagram showing an internal configuration of a ferroelectric memory device according to a third embodiment of the present invention.

FIG. 5 is a circuit diagram showing an internal configuration of a ferroelectric memory device according to a third embodiment of the present invention. A configuration of each of cell arrays CAs may be similar to that of each cell array CA according to the second embodiment. However, each column blocks CB0-CB3 includes different columns from the second embodiment. The column block CB0 includes CL1 and CL4. The column block CB1 includes CL2 and CL3. The column block CB2 includes CL5 and CL8. The column block CB3 includes CL6 and CL7.

Further, according to the third embodiment, differently from the second embodiment, the number of plate lines is two and that of reset line is four. The reset lines RS0-RS3 corresponds to the column blocks CB0-CB3. The reset lines RS0-RS3 connect to gates of the reset transistors RT1 and RT4, RT2 and RT3, RT5 and RT8, RT6 and RT7. The reset transistors RT1 and RT4 are provided for the column block CB0. The reset transistors RT2 and RT3 are provided for the column block CB1. The reset transistors RT5 and RT8 are provided for the column block CB2. The reset transistors RT6 and RT7 are provided for the column block CB3. One of the reset lines selects one of the four column blocks.

The plate line PL0 is provided for the columns CL1, CL2, CL5 and CL6 respectively included in the different column blocks CB0-CB3. The plate line PL0 connects to the second electrodes E2 of the columns CL1, CL2, CL5 and CL6. The plate line PL1 is provided for the columns CL3, CL4, CL7 and CL8 respectively included in the different column blocks CB0-CB3. The plate line PL1 connects to the second electrodes E2 of the columns CL3, CL4, CL7 and CL8. One of the plate lines selects a column included in the selected column block. That is, the role of the reset lines and the role of the plate lines in the third embodiment is reversed those in the second embodiment.

Bit selection lines BS0 to BS3 are provided to correspond to the respective reset lines RS0 to RS3. For example, if the reset line RS0 is selected, the bit selection line BS0 is selected. Likewise, if the reset line RSi (i=1 to 3) is selected, the bit selection line BSi is selected. The bit node BNi (i=1 to 8) in the selected column CLi is connected to one bit line BL via the selection transistor STi.

According to the third embodiment, the sum of the number of plate lines and that of reset lines is six. Therefore, it is possible to decrease the total number of plate lines and the reset lines of the ferroelectric memory device and to downsize the ferroelectric memory device.

The third embodiment is applicable to both the 1T-1C ferroelectric memory device and the 2T-2C ferroelectric memory device, similarly to the first embodiment.

In the embodiments stated above, the plate lines PLs, the reset lines RSs, and the reset transistors RTs may be conceptually considered to function as a decoder DEC. Referring to FIG. 1, for example, the decoder DEC supplies two pieces of one-bit data (two-bit data in all) to one of the plate lines PLs and one of the reset lines RSs, respectively. The decoder DEC can thereby select a specific column CL. Referring to FIG. 4, the decoder DEC supplies two-bit data and one-bit data (three-bit data in all) to one of the plate lines PLs and one of the reset lines RSs, respectively. The decoder DEC can thereby select a specific column CL. Referring to FIG. 5, the decoder DEC supplies one-bit data and two-bit data (three-bit data in all) to one of the plate lines PLs and one of the reset lines RSs, respectively. The decoder DEC can thereby select a specific column CL.

The above-stated embodiments can be generalized as follows. $2^R$ columns can be driven by $2^p$ plate lines and $2^q$ reset lines, where R, p, and q are natural numbers and satisfy R=p+q.

Figure 6:
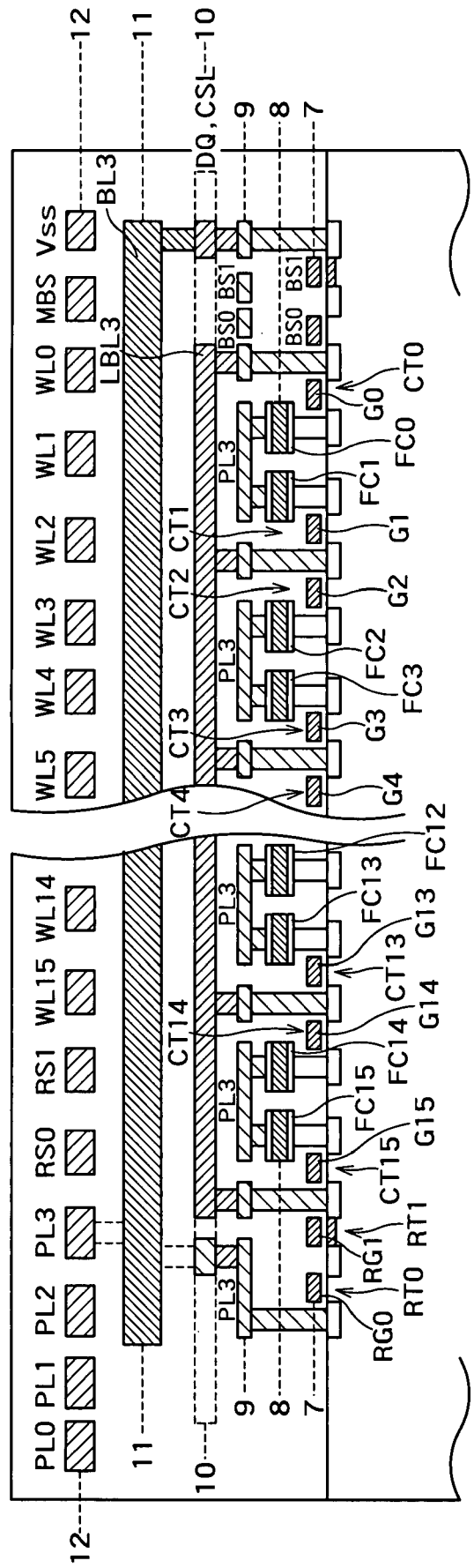
FIG. 6 is a cross-sectional view of the memory cell array according to the second embodiment.

FIG. 6 is a cross-sectional view of the memory cell array CA according to the second embodiment shown in FIG. 4. Referring to FIG. 6, 16 word lines WL0 to WL15, the two reset lines RS0 and RS1, and the four plate lines PL0 to PL3 are provided. The word lines WL0 to WL15 are electrically connected to gates G0 to G15 of cell transistors CT0 to CT15, respectively. Ferroelectric capacitors FC0 to FC15 are provided to correspond to the respective cell transistors CT0 to CT15.

The reset lines RS0 and RS1 are connected to gates RG0 and RG1 of reset transistors RT0 and RT1, respectively. A main bit line BL3 and a local bit line LBL3 are provided between the word lines WL0 to WL15 and the ferroelectric capacitors FC0 to FC15.

Figure 7:
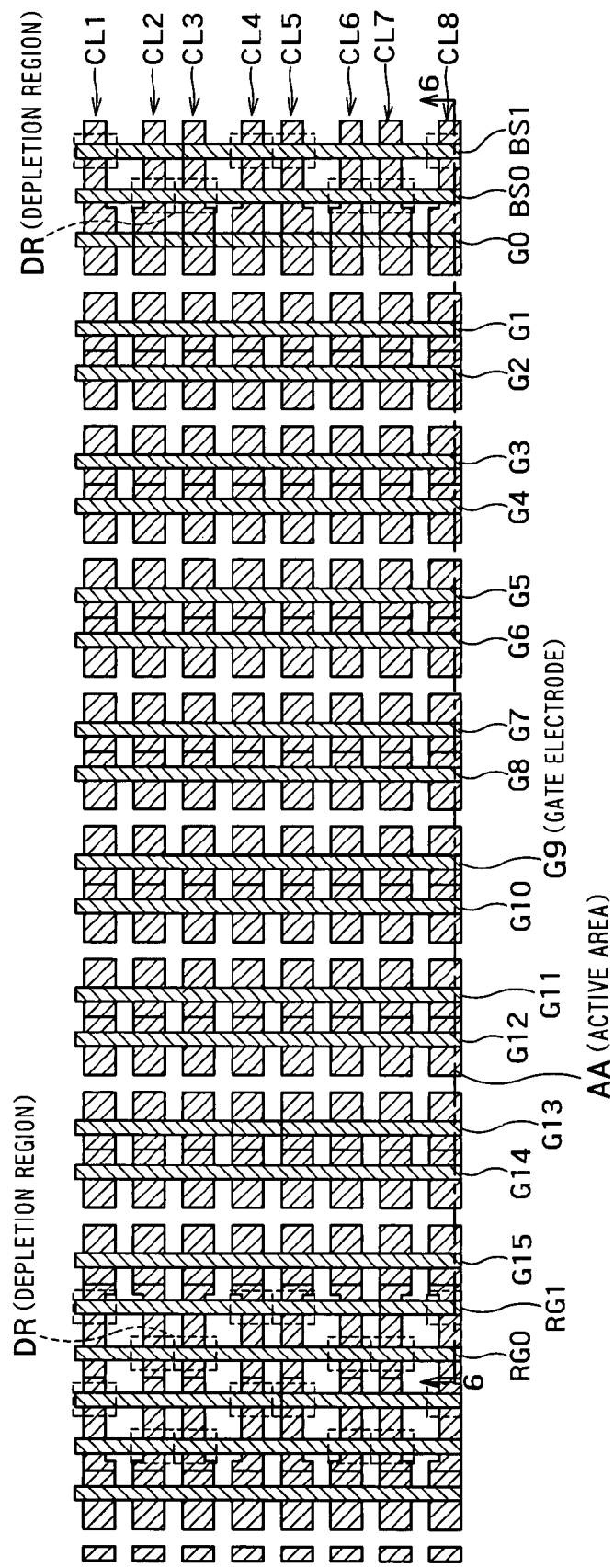
FIG. 7 is a layout view at the time of forming gate electrodes of the cell transistors CT0 to CT15 and those of the reset transistors RT0 and RT1.

FIG. 7 is a layout view at the time of forming gate electrodes of the cell transistors CT0 to CT15 and those of the reset transistors RT0 and RT1. FIG. 7 corresponds to a plan view along a line 7-7 of FIG. 6. Furthermore, FIG. 6 corresponds to a cross-sectional view taken along a line 6-6 of FIG. 7. It is to be noted, however, that bit line contacts and plate line contacts are not shown in FIG. 7 because they are not formed yet at the time of forming the gate electrodes.

Gate electrodes G0 to G15 are formed on an active area AA. The gate electrodes G0 to G15 extend almost in parallel to the word lines WLs (orthogonally to the bit lines BLs).

In each of the columns CL1, CL4, CL5 and CL8 controlled by the reset line RS0, the area under the gate RG1 of the reset transistor RT1 corresponding to the reset line RS1 is doped to make depletion type transistor. The columns CL1, CL4, CL5 and CL8 are thereby controlled by the reset line RS0 irrespectively of the reset line RS1. On the other hand, in each of the columns CL2, CL3, CL6 and CL7 controlled by the reset line RS1, the area under the gate RG0 of the reset transistor RT0 corresponding to the reset line RS0 is doped to make depletion type transistor. The columns CL2, CL3, CL6 and CL7 are thereby controlled by the reset line RS1 irrespectively of the reset line RS0.

Figure 8:
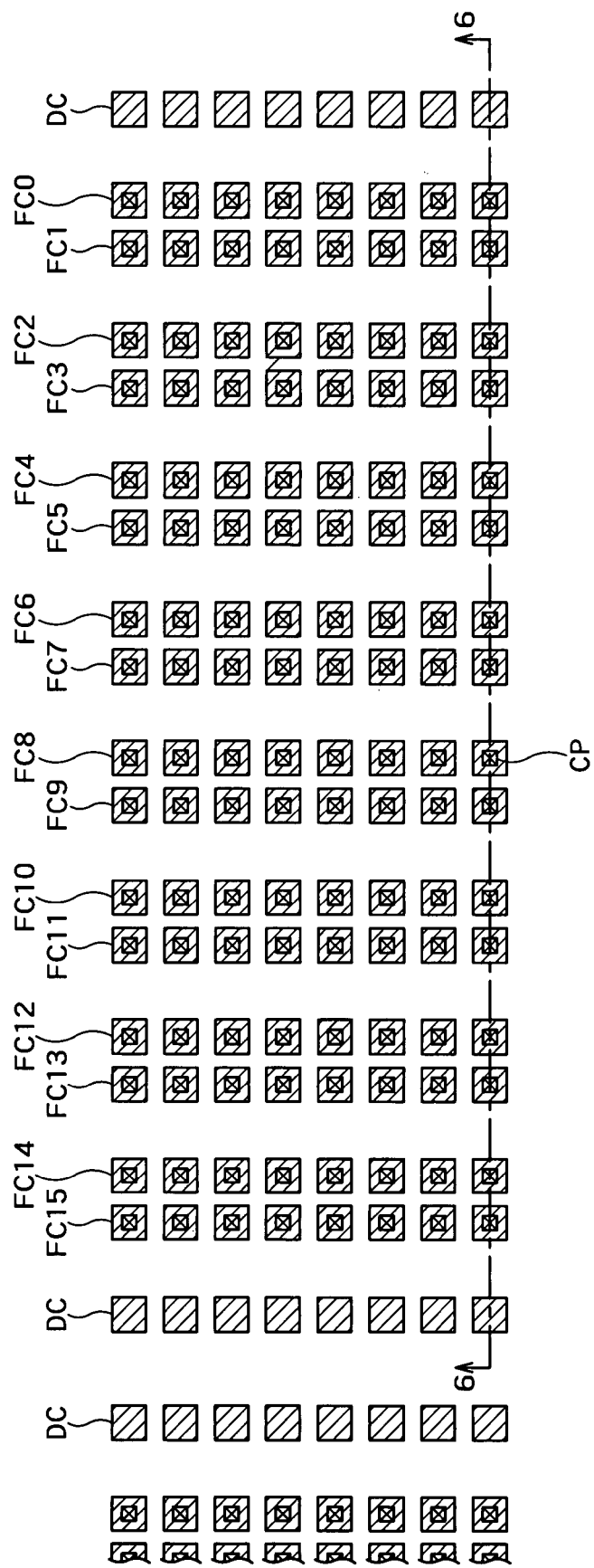
FIG. 8 shows a pattern at the time of forming electrodes of the ferroelectric capacitors FC0 to FC15.

FIG. 8 shows a pattern at the time of forming electrodes of the ferroelectric capacitors FC0 to FC15. FIG. 8 corresponds to a plan view along a line 8-8 of FIG. 6. FIG. 6 corresponds to a cross-sectional view taken along a line 6-6 of FIG. 8. It is to be noted, however, that bit line contacts and plate line contacts are not shown in FIG. 8 because they are not formed yet at the time of forming the electrodes of the ferroelectric capacitors FC0 to FC15.

A contact plug CP is provided in a central portion of each of the electrodes of the ferroelectric capacitors FC0 to FC15. Lower electrodes of the ferroelectric capacitors FC0 to FC15 are connected to a diffusion layer on a semiconductor substrate via the respective contact plugs CPs.

Dummy capacitors DCs are provided between two adjacent memory cell arrays. The dummy capacitors DCs are formed in a space between the two adjacent memory cell arrays so as to reduce dimensional irregularities among the ferroelectric capacitors FC0 to FC15. The dummy capacitors DCs do not at all function as circuit elements.

Figure 9:
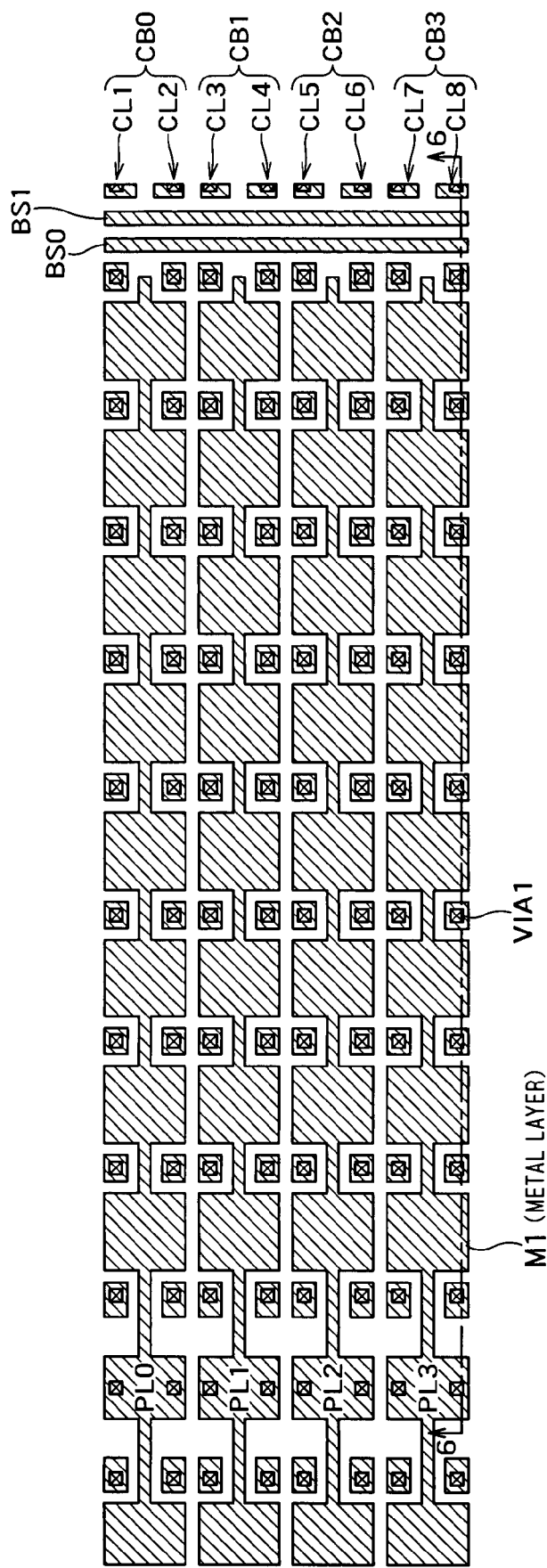
FIG. 9 shows a metal wiring pattern at the time of forming the plate lines PL0 to PL3.

FIG. 9 shows a metal wiring pattern at the time of forming the plate lines PL0 to PL3. FIG. 9 corresponds to a plan view along a line 9-9 of FIG. 6. FIG. 6 corresponds to a cross-sectional view taken along a line 6-6 of FIG. 9. Namely, FIG. 6 shows only a cross section of the plate line PL3.

Metal layers M1 of the plate lines PL0 to PL3 are formed to correspond to the column blocks CB0 to CB3, respectively. Reference symbol VIA1 denotes a contact connecting a drain layer of each cell transistor CT to the local bit line LBL2.

Figure 10:
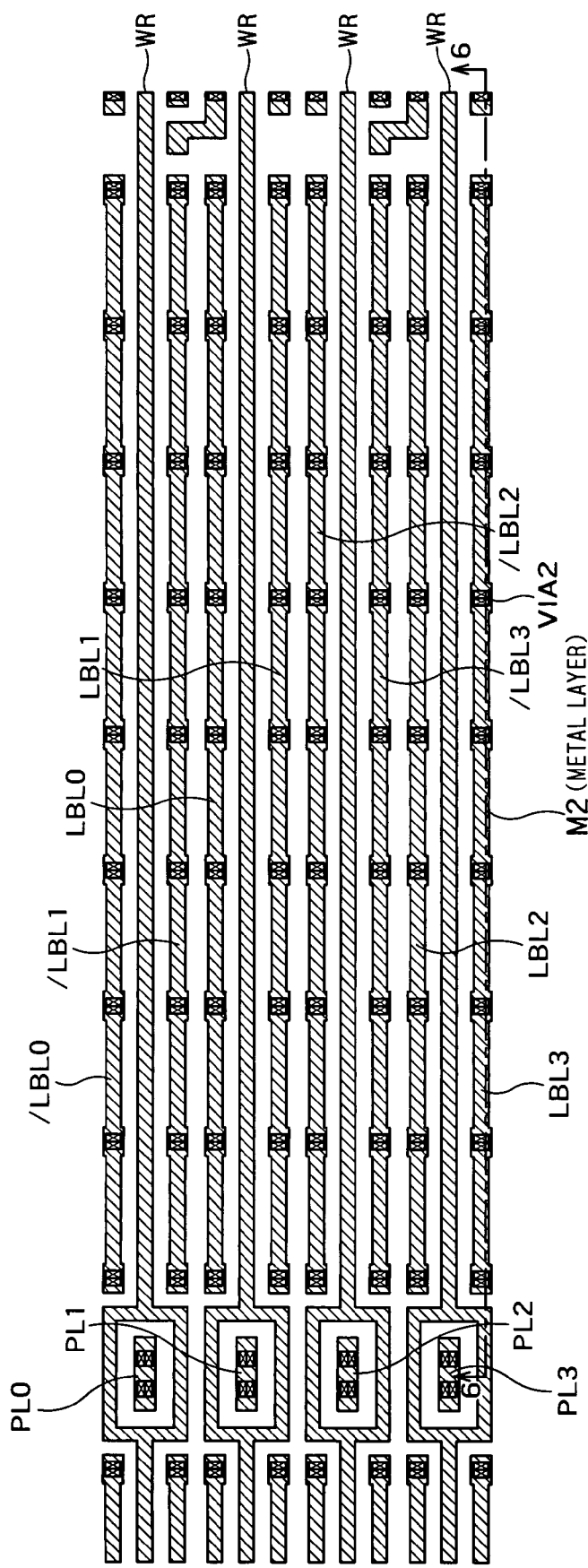
FIG. 10 shows a metal wiring pattern at the time of forming local bit lines.

FIG. 10 shows a metal wiring pattern at the time of forming local bit lines LBL0 to LBL3 and /LBL0 to /LBL3. FIG. 10 corresponds to a plan view along a line 10-10 of FIG. 6. FIG. 6 corresponds to a cross-sectional view taken along a line 6-6 of FIG. 10. Namely, FIG. 6 shows a cross section of the local bit line LBL3.

The local bit lines LBL0 to LBL3 and /LBL0 to /LBL3 are connected to the contacts VIA1 via contacts VIA2, and connected to the drain layer of each cell transistor CT via each contact VIA1.

Wirings WRs provided to be adjacent to the local bit lines LBL0 to LBL3 and /LBL0 to /LBL3 are applicable as various data lines.

Figure 11:
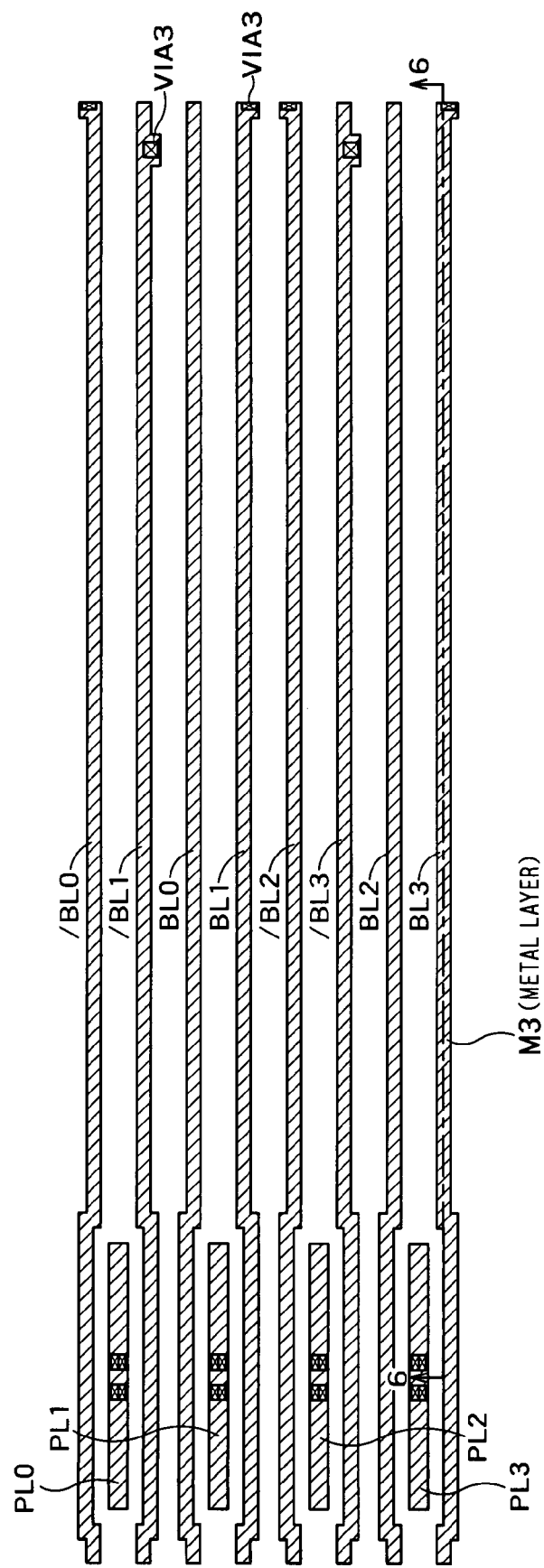
FIG. 11 shows a metal wiring pattern at the time of forming main bit lines.

FIG. 11 shows a metal wiring pattern at the time of forming main bit lines BL0 to BL3 and /BL0 to /BL3. FIG. 11 corresponds to a plan view along a line 11-11 of FIG. 6. FIG. 6 corresponds to a cross-sectional view taken along a line 6-6 of FIG. 11. Namely, FIG. 6 shows a cross section of the main bit line BL3.

The main bit lines BL0 to BL3 and /BL0 to /BL3 are connected to the contacts VIA2 via contacts VIA3.

The local bit lines LBL0 to LBL3 and /LBL0 to /LBL3 shown in FIG. 10 and the main bit lines BL0 to BL3 and /BL0 to /BL3 shown in FIG. 11 are almost orthogonal to the word lines WLs.

Figure 12:
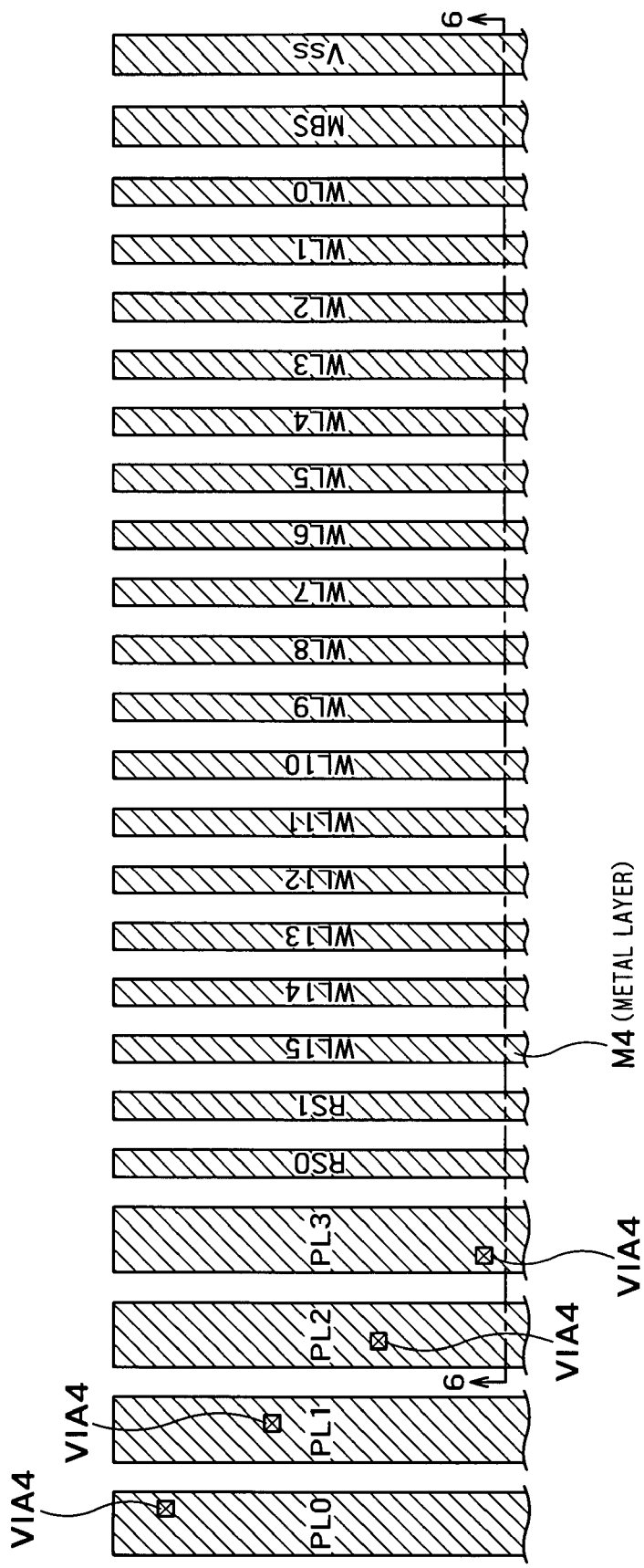
FIG. 12 shows a metal wiring pattern at the time of forming the word lines, the reset lines, and the plate lines.

FIG. 12 shows a metal wiring pattern at the time of forming the word lines WLs, the reset lines RSs, and the plate lines PLs. FIG. 12 corresponds to a plan view along a line 12-12 of FIG. 6. FIG. 6 corresponds to a cross-sectional view taken along a line 6-6 of FIG. 12.

The plate lines PL0 to PL3 are connected to plates PL0 to PL3 of a metal layer M3 via contacts VIA4.

The word lines WL0 to WL15, the reset lines RS0 and RS1, and the plate lines PL0 to PL3 extend almost in parallel and almost orthogonally to the main bit lines BLs and /BLs and the local bit lines LBLs and /LBLs.

While the wiring patterns in a manufacturing process according to the second embodiment have been described, the ferroelectric memory devices according to the embodiments other than the second embodiment can be easily manufactured by changing the wiring patterns.

The invention claimed is:

1. A semiconductor memory device comprising:
a ferroelectric capacitor including a ferroelectric between a first electrode and a second electrode;
a cell transistor having a source connected to the first electrode;
a cell array in which a plurality of memory cells including the ferroelectric capacitors and the cell transistors are arranged in a matrix on a semiconductor substrate;
a plurality of bit lines provided to correspond to columns of the memory cells and connected to a drain of the cell transistor;
a plurality of word lines provided to correspond to rows of the memory cells and connected to a gate of the cell transistor;
n plate lines corresponding to n column blocks and connected to the second electrodes of the ferroelectric capacitors in the corresponding column blocks, respectively, the n column blocks being obtained by dividing the cell array into the n column blocks for every set of m columns, where $n \geq 2$ and $m \geq 2$;
a plurality of reset transistors connected between the bit lines and the n plate lines; and
m reset lines corresponding to the m columns within the column blocks and connected to gates of n reset transistors of the reset transistors, the n reset transistors being respectively provided in n columns respectively included in the n column blocks.

2. The semiconductor memory device according to claim 1, wherein during data writing or data reading, one of the plate lines selects one of the column blocks in the cell array and applies a potential to the ferroelectric capacitor within the selected column block, and
one of the reset lines selects one of the columns within the selected column block and turns off the reset transistors provided in the selected column.

3. The semiconductor memory device according to claim 1, wherein one of the bit lines corresponding to a first column block of the n column blocks is provided between the bit lines included in a second column block adjacent to the first column block, and
one of the bit lines corresponding to a second column block of the n column blocks is provided between the bit lines included in the first column block.

4. The semiconductor memory device according to claim 2, wherein one of the bit lines corresponding to a first column block of the n column blocks is provided between the bit lines included in a second column block adjacent to the first column block rather than the first column block, and
one of the bit lines corresponding to a second column block of the n column blocks is provided between the bit lines included in the first column block.

5. The semiconductor memory device according to claim 1, wherein when number of the columns of the memory cells is $2^R$, number of the plate lines is $2^p$, and number of the reset lines is $2^q$, a relation of $R = p+q$ is satisfied.

6. The semiconductor memory device according to claim 2, wherein when number of the columns of the memory cells is $2^R$, number of the plate lines is $2^p$, and number of the reset lines is $2^q$, a relation of $R = p+q$ is satisfied.

7. The semiconductor memory device according to claim 3, wherein when number of the columns of the memory cells is $2^R$, number of the plate lines is $2^p$, and number of the reset lines is $2^q$, a relation of R=p+q is satisfied.

8. A semiconductor memory device comprising:
a ferroelectric capacitor including a ferroelectric between a first electrode and a second electrode;
a cell transistor having a source connected to the first electrode;
a cell array in which a plurality of memory cells including the ferroelectric capacitors and the cell transistors are arranged in a matrix on a semiconductor substrate;
a plurality of bit lines provided to correspond to columns of the memory cells and connected to a drain of the cell transistor;
a plurality of word lines provided to correspond to rows of the memory cells and connected to a gate of the cell transistor;
a plurality of reset transistors connected between the bit lines and the plate lines;
n reset lines corresponding to n column blocks, the n column blocks being obtained by dividing the cell array into the n column blocks for every set of m columns, where n≧2 and m≧2, the n reset lines being connected to gates of m reset transistors provided for one of the n column blocks; and
m plate lines provided for the n columns respectively included in the n different column blocks and connected to the second electrodes provided in the n columns.

9. The semiconductor memory device according to claim 8, wherein during data writing or data reading, one of the reset lines selects one of the column blocks in the cell array and turns off m reset transistors of the reset transistors, the m reset transistors being provided to correspond to the m columns within the selected column block, and
one of the plate lines selects one of the columns within the selected column block and applies a potential to the ferroelectric capacitor provided in the selected column.

10. The semiconductor memory device according to claim 8, wherein one of the bit lines corresponding to a first column block of the n column blocks is provided between the bit lines included in a second column block adjacent to the first column block, and
one of the bit lines corresponding to a second column block of the n column blocks is provided between the bit lines included in the first column block.

11. The semiconductor memory device according to claim 9, wherein one of the bit lines corresponding to a first column block of the n column blocks is provided between the bit lines included in a second column block adjacent to the first column block, and
one of the bit lines corresponding to a second column block of the n column blocks is provided between the bit lines included in the first column block.

12. The semiconductor memory device according to claim 8, wherein when number of the columns of the memory cells is $2^R$, number of the plate lines is $2^p$, and number of the reset lines is $2^q$, a relation of R=p+q is satisfied.

13. The semiconductor memory device according to claim 9, wherein when number of the columns of the memory cells is $2^R$, number of the plate lines is $2^p$, and number of the reset lines is $2^q$, a relation of R=p+q is satisfied.

14. The semiconductor memory device according to claim 10, wherein when number of the columns of the memory cells is $2^R$, number of the plate lines is $2^p$, and number of the reset lines is $2^q$, a relation of R=p+q is satisfied.

* * * * *